United States Patent
Oskotsky et al.

(10) Patent No.: US 7,317,583 B2
(45) Date of Patent: Jan. 8, 2008

(54) HIGH NUMERICAL APERTURE PROJECTION SYSTEM AND METHOD FOR MICROLITHOGRAPHY

(75) Inventors: Mark L Oskotsky, Mamaroneck, NY (US); Stanislav Smirnov, Bethel, CT (US)

(73) Assignee: ASML Holding, N.V., Veldhoven (NL)

( * ) Notice: Subject to any disclaimer, the term of this patent is extended or adjusted under 35 U.S.C. 154(b) by 0 days.

(21) Appl. No.: 10/224,485

(22) Filed: Aug. 21, 2002

(65) Prior Publication Data

US 2003/0039028 A1 Feb. 27, 2003

Related U.S. Application Data

(60) Provisional application No. 60/331,785, filed on Nov. 21, 2001, provisional application No. 60/313,501, filed on Aug. 21, 2001.

(51) Int. Cl.
*G02B 17/08* (2006.01)

(52) U.S. Cl. .............. 359/727; 359/726; 359/730; 359/857; 359/858; 359/860

(58) Field of Classification Search .............. 359/366, 359/364, 726, 727, 730, 731, 857, 858, 859, 359/860, 861
See application file for complete search history.

(56) References Cited

U.S. PATENT DOCUMENTS

| | | |
|---|---|---|
| 4,953,960 A | 9/1990 | Williamson |
| 5,052,763 A * | 10/1991 | Singh et al. ............... 359/355 |
| 5,212,593 A | 5/1993 | Williamson et al. |
| 5,537,260 A | 7/1996 | Williamson |
| 5,583,696 A | 12/1996 | Takahashi |

(Continued)

FOREIGN PATENT DOCUMENTS

| | | |
|---|---|---|
| EP | 0 608 572 A2 | 8/1994 |
| EP | 1 102 100 A2 | 5/2001 |
| WO | WO/01/82000 A1 | 11/2001 |

OTHER PUBLICATIONS

European Search Report issued May 25, 2005 for Appln. No. 02 018 247.3, 5 pages.

(Continued)

*Primary Examiner*—Joshua L. Pritchett
(74) *Attorney, Agent, or Firm*—Sterne, Kessler, Goldstein & Fox, P.L.L.C

(57) ABSTRACT

The present invention relates to a high numerical aperture exposure system having a wafer. The exposure system in the present invention includes a beam-splitter, a reticle, a reticle optical group, where the reticle optical group is placed between the reticle and the beam-splitter, a concave mirror, a concave mirror optical group, where the concave mirror optical group is placed between the concave mirror and the beam-splitter, a fold mirror, where the fold mirror is placed between the beam-splitter and the wafer, and a wafer optical group, where the wafer optical group is placed between the beam-splitter and the wafer. In the present invention, a beam of light is directed through the reticle and the reticle optical group to the beam-splitter, then it is reflected by the beam-splitter onto the concave mirror. Concave mirror reflects the light onto the fold mirror through the beam-splitter. Fold mirror reflects the light onto the wafer through the wafer optical group. The present invention forms an intermediate image between the fold mirror and the wafer optical group. Furthermore, in an embodiment an aperture stop can be placed between the concave mirror optical group and the concave mirror.

25 Claims, 9 Drawing Sheets

U.S. PATENT DOCUMENTS

| | | |
|---|---|---|
| 5,636,066 A | 6/1997 | Takahashi |
| 5,691,802 A | 11/1997 | Takahashi |
| 5,694,241 A | 12/1997 | Ishiyama et al. |
| 5,715,084 A | 2/1998 | Takahashi et al. |
| 5,808,805 A | 9/1998 | Takahashi |
| 5,835,284 A | 11/1998 | Takahashi et al. |
| 5,966,216 A * | 10/1999 | Galburt et al. ............. 356/401 |
| 5,969,882 A | 10/1999 | Takahashi |
| 5,999,333 A | 12/1999 | Takahashi |
| 6,069,749 A * | 5/2000 | Omura ....................... 359/727 |
| 6,424,471 B1 * | 7/2002 | Ulrich et al. ............... 359/732 |
| 6,486,940 B1 * | 11/2002 | Williamson ................. 355/67 |
| 6,624,880 B2 * | 9/2003 | Sandstrom et al. ........... 355/71 |
| 2002/0012107 A1 * | 1/2002 | Suzuki ....................... 355/52 |

OTHER PUBLICATIONS

Patent Abstracts of Japan, Publication No. 2002-182112, English Language Abstract for JP Patent Application No. 2000-384709.

Nonogaki, S. et al., *Microlithography Fundamentals in Semiconductor Devices and Fabrication Technology*, Marcel Dekker, Inc., ISBN 0-8247-9951-8, Entire Book (1998).

* cited by examiner

HIGH NUMERICAL APERTURE PROJECTION SYSTEM AND METHOD FOR MICROLITHOGRAPHY

CROSS-REFERENCE TO RELATED APPLICATIONS

This application claims priority to U.S. Provisional Patent Application 60/313,501, to Smirnov et al., filed Aug. 21, 2001, which is incorporated herein by reference in its entirety.

This application claims priority to U.S. Provisional Application 60/331,785, to Smirnov et al., filed Nov. 21, 2001, which is incorporated herein by reference in its entirety.

REFERENCE TO MICROFICHE APPENDIX/SEQUENCE LISTING/TABLE/COMPUTER PROGRAM LISTING APPENDIX

This application includes an appendix titled "Appendix A. Table 1. Unfolded variant of projection system 102." The appendix contains two (2) pages of data relating to an embodiment of the present invention.

BACKGROUND OF THE INVENTION

1. Field of the Invention

This invention relates to improved lithography systems and methods. More specifically, this invention relates to microlithography systems and methods having a high numerical aperture.

2. Background Art

Lithography is a process used to create features on the surface of substrates. Such substrates can include those used in the manufacture of flat panel displays, circuit boards, various integrated circuits, and the like. A frequently used substrate for such applications is a semiconductor wafer. While this description is written in terms of a semiconductor wafer for illustrative purposes, one skilled in the art would recognize that this description also applies to other types of substrates known to those skilled in the art. During lithography, a wafer, which is disposed on a wafer stage, is exposed to an image projected onto the surface of the wafer by exposure optics located within a lithography apparatus. The image refers to the original, or source, image being exposed. The projected image refers to the image incident on the surface of the wafer. While exposure optics are used in the case of lithography, a different type of exposure apparatus may be used depending on the particular application. For example, some lithographies each may require a different exposure apparatus, as is known to those skilled in the art. The particular example of lithography is discussed here for illustrative purposes only.

The projected image produces changes in the characteristics of a layer, such as photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface of the wafer.

Step-and-scan technology works in conjunction with a projection optics system that has a narrow imaging slot. Rather than expose the entire wafer at one time, individual fields are scanned onto the wafer one at a time. This is done by moving the wafer and reticle such that the imaging slot is moved across the field during the scan. The wafer stage must then be stepped between field exposures to allow multiple copies of the reticle pattern to be exposed over the wafer surface. In this manner, the quality of the image projected onto the wafer is maximized.

The following patents describe examples of conventional technology for generating images on the semiconductor wafer from a pattern on the reticle: U.S. Pat. No. 4,953, 960, to Williamson, U.S. Pat. No. 5,212,593, to Williamson et al., U.S. Pat. No. 5,537,260, to Williamson, U.S. Pat. No. 5,636,066, to Takahashi, U.S. Pat. No. 5,583,696, to Takahashi, U.S. Pat. No. 5,691,802, to Takahashi, U.S. Pat. No. 5,808,805, to Takahashi, U.S. Pat. No. 5,835,284, to Takahashi, U.S. Pat. No. 5,969,882, to Takahashi.

BRIEF SUMMARY OF THE INVENTION

The present invention relates to microlithography. More specifically, the present invention relates to systems and methods for a high numerical aperture exposure system having a semiconductor wafer.

The exposure system in the present invention includes a reticle, a reticle optical group, a beam-splitter, a concave mirror, a concave mirror optical group, a fold mirror, and a wafer optical group. The reticle optical group is placed between the reticle and the beam-splitter. The concave mirror optical group is placed between the concave mirror and the beam-splitter. The fold mirror is placed between the beam-splitter and the wafer. The wafer optical group is placed between the beam-splitter and the wafer. In an embodiment, a plurality of quarter wave plates are distributed between the reticle and the beam-splitter, between the concave mirror and the beam-splitter, and/or between the beam-splitter and the wafer optical group. In another embodiment, an aperture stop can be placed between the concave mirror and the concave mirror optical group.

In the present invention, a beam of light is directed through the reticle and the reticle optical group to the beam-splitter. The beam-splitter reflects the light onto the concave mirror. The concave mirror reflects the light onto the fold mirror through the beam-splitter. A quarter wave plate changes polarization of light reflected from the concave mirror so that the light passes through the beam-splitter onto the fold mirror. The fold mirror reflects the light onto the wafer through the wafer optical group. An intermediate image forms between the fold mirror and the wafer optical group when the light is reflected by the fold mirror towards the wafer optical group. The light is further magnified, focused and/or aligned by the optical elements and groups before forming an image on the semiconductor wafer.

Further features and advantages of the present invention as well as the structure and operation of various embodiments of the present invention are described in detail below with reference to the accompanying drawings.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1b illustrates an aperture stop in the exposure system of FIG. 1a.

The present invention is described with reference to the accompanying drawings. In the drawings, like reference numbers indicate identical or functionally similar elements. Additionally, the leftmost digit of a reference number identifies the drawing in which the reference number first appears.

DETAILED DESCRIPTION OF THE INVENTION

Table of Contents

Figure 1A:
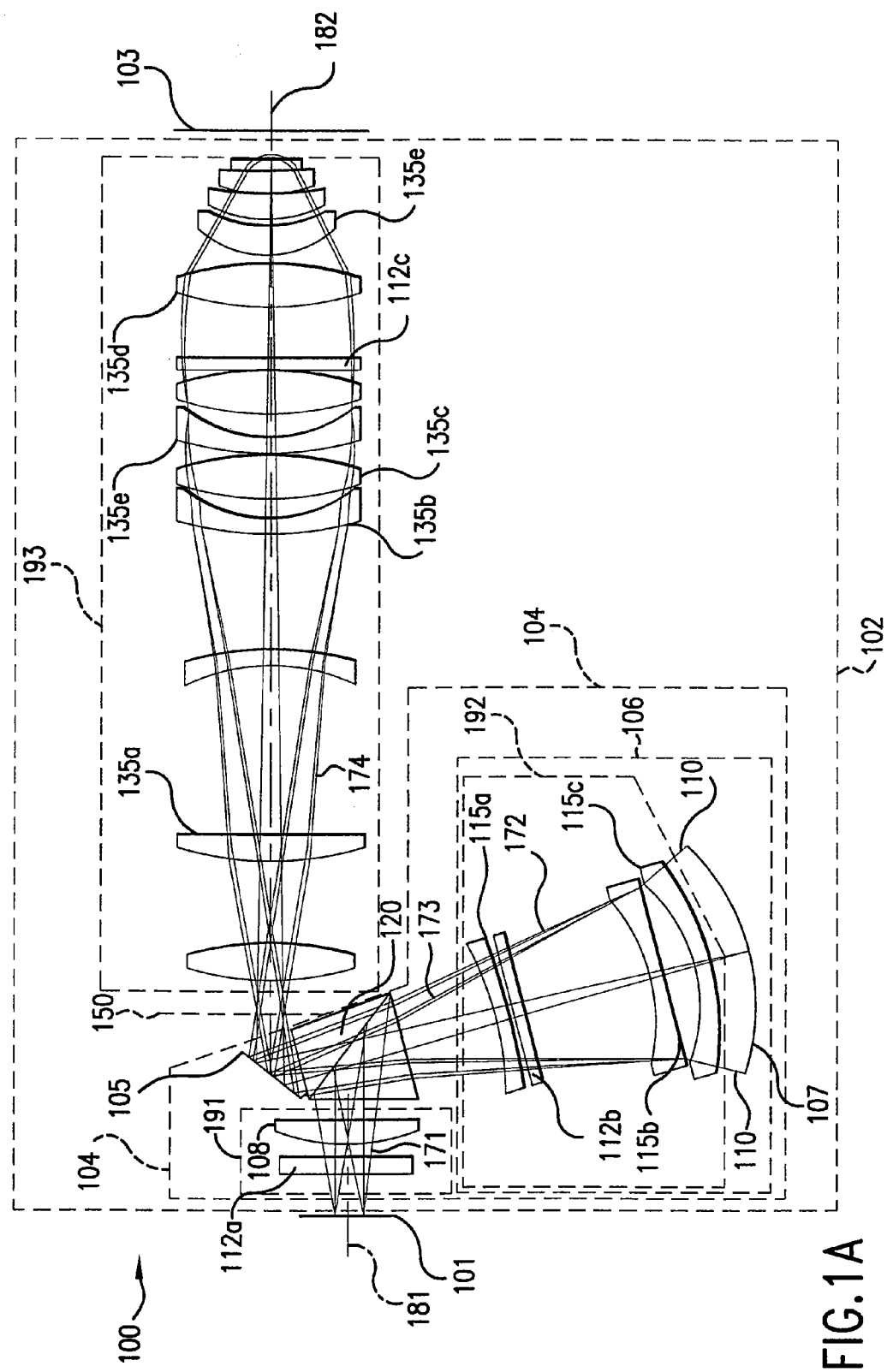
FIG. 1a illustrates a high numerical aperture exposure system, according to the present invention.

1. Overview.

2. Terminology.

3. High Numerical Aperture Exposure System for Microlithography.
   A. A First Embodiment.
      i. Image Path.
   B. Other Example Embodiments.
   C. Exposure System With Perpendicular Arrangement of Reticle and Semiconductor Wafer.
      i. Image Path.

4. Conclusion.

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

1. Overview

Photolithography (also called microlithography) is a semiconductor fabrication technology. Photolithography uses ultraviolet or visible light to generate fine patterns in a semiconductor device design. Many types of semiconductor devices, such as, diodes, transistors, and integrated circuits, can be fabricated using photolithographic techniques. Exposure systems or tools are used to carry out photolithographic techniques, such as etching, in semiconductor fabrication. An exposure system can include a light source, reticle, optical projection system, and a wafer alignment stage. An image of a semiconductor pattern is printed or fabricated on the reticle (also called a mask). A light source illuminates the reticle to generate an image of the particular reticle pattern. An optical reduction system is used to pass a high-quality image of the reticle pattern to a wafer. See, Nonogaki et al., *Microlithography Fundamentals in Semiconductor Devices and Fabrication Technology* (Marcel Dekker, Inc.: New York, N.Y. 1998), incorporated in its entirety herein by reference.

Integrated circuit designs are becoming increasingly complex. The number of components and integration density of components in layouts is increasing. Demand for an ever-decreasing minimum feature size is high. The minimum feature size (also called line width) refers to the smallest dimension of a semiconductor feature that can be fabricated within acceptable tolerances. As result, it is increasingly important that photolithographic systems and techniques provide a higher resolution. One approach to improve resolution is to shorten the wavelength of light used in fabrication. Increasing the numerical aperture (NA) of the optical reduction system also improves resolution.

Projection systems also can include optical reduction systems to reduce an image. One type of reduction is a catadioptric optical reduction systems. Catadioptric optical reduction systems include a mirror that reflects the imaging light after it passes through the reticle onto a wafer. A beam splitter is used in the optical path of the system. A conventional beam splitter, however, transmits 50% of input light and reflects 50% of the input light. A polarization beam splitter can also be used which reduces light loss.

There are several disadvantages associated with conventional optical systems. Conventional optical systems do not form an intermediate image before forming an image pattern on the semiconductor wafer. This results in difficulties when correcting monochromatic and chromatic aberrations of an image on the wafer. Also, conventional refractive optical systems are not capable of working with a lower light wavelength because of absence of plurality of transparent materials at short wavelengths (157 nm) suitable for real manufacturing process. Therefore, there is a need for a better system that is capable of generating a better quality image on the semiconductor wafer.

2. Terminology

To more clearly delineate the present invention, an effort is made throughout the specification to adhere to the following term definitions as consistently as possible.

"Aperture stop" is a physical constraint, for example a lens diaphragm retainer, that limits the diameter of a light beam bundle allowed to pass through a lens for central (axial) point of object.

"Aspheric mirror" is a mirror that has a non-spherical surface. The aspheric surface of a mirror can be used in a catadioptric optical system to advance or retard an incident electromagnetic energy wavefront relative to the reflective action of a spherical surface.

"Beam-splitter" is an optical device for dividing a beam into two or more separate beams. A beam-splitter can include but is not limited to a non-polarized beam-splitter or a polarized beam-splitter.

"Catadioptric optical system" means an optical system having reflective and refractive optical elements.

3. High Numerical Aperture Exposure System for Microlithography

A. First Embodiment

FIG. 1a illustrates an embodiment of exposure system 100. Exposure system 100 includes a reticle 101, a projection system 102 and a wafer 103. Reticle 101 is optically coupled to projection system 102. Projection system 102 is optically coupled to wafer 103. In the embodiment of FIG. 1a, projection system 102 is placed between reticle 101 and wafer 103.

Projection system 102 includes an intermediate image formation system 104 and a wafer optical group 193. Intermediate image formation system 104 is optically coupled to wafer optical group 193. Intermediate image formation system 104 further includes a catadioptric reduction system 106.

Projection system 102 includes a reticle optical group 191, a beam-splitter 120, a concave mirror optical group 192, a concave mirror 107, a fold mirror 105, wafer optical group 193. Reticle optical group 191, beam-splitter 120, concave mirror optical group 192, concave mirror 107, and fold mirror 105 are part of intermediate image formation system 104. Furthermore, concave mirror optical group 192 and concave mirror 107 are part of catadioptric reduction system 106.

Reticle optical group 191 is placed between reticle 101 and beam-splitter 120. Concave mirror optical group 192 is placed between concave mirror 107 and beam-splitter 120. Fold mirror 105 is optically coupled to beam-splitter 120. Wafer optical group 193 is placed between fold mirror 105 and wafer 103. Beam-splitter 120 separates fold mirror 105 and concave mirror optical group 192. Furthermore, beam-splitter 120 and fold mirror 105 separate reticle optical group 191 and wafer optical group 193.

In an embodiment, reticle 101 is parallel to wafer 103. Furthermore, reticle 101 and reticle optical group 191 and wafer 103 and wafer optical group 193 are placed on parallel or same optical beam axis. Reticle 101 and reticle optical group 191 are placed on a first beam axis 181. Wafer 103 and wafer optical group 193 are placed on a second beam axis 182. First beam axis 181 and second beam axis 182 are parallel to each other. Because reticle 101 and wafer 103 are perpendicularly arranged with respect to their corresponding beam axes, reticle 101 and wafer 103 are parallel to each other. It is understood by one having ordinary skill in the art, that other configurations of each optical object in projection system 102 are possible.

Reticle optical group 191 includes a first quarter wave plate 112a and an aspheric surface 108. First quarter wave plate 112a is placed between reticle 101 and aspheric surface 108. Aspheric surface 108 is placed between first quarter wave plate 112a and beam-splitter 120. In an embodiment, aspheric surface 108 can be a surface of lens having a positive or a negative refractive power. Furthermore, reticle optical group 191 can have a plurality of aspheric surfaces similar to aspheric surface 108.

Concave mirror optical group 192 includes a plurality of aspheric surfaces 115(a, b, c) and a second quarter wave plate 112b. In an embodiment, second quarter wave plate 112b can be placed between any two aspheric surfaces 115(a, b, c), as shown in FIG. 1a. Furthermore, second quarter wave plate 112b can be placed between aspheric surface 115a and beam-splitter 120. In another embodiment, concave mirror optical group 192 includes aperture stop 110. Aperture stop 110 can be placed between aspheric surface 115c and concave mirror 107. Aperture stop 110 provides an optical aperture for light to pass through when light is directed from beam-splitter 120 and reflected by concave mirror 107. As would be understood by one having ordinary skill in the art concave mirror optical group 192 can include at least one aspheric surface 115 or none at all. Furthermore, aspheric surfaces 115(a, b, c) can be ones of lenses with either positive or negative refractive power.

Beam-splitter 120 separates fold mirror 105 and concave mirror optical group 192. In an embodiment, fold mirror 105 is a flat mirror. In another embodiment, fold mirror 105 is a mirror having optical power.

Wafer optical group 193 includes a plurality of aspheric surfaces 135(a, b, c, d, e) and a third quarter wave plate 112c. Third quarter wave plate 112c and aspheric surfaces 135(a, b, c, d, e) are placed between fold mirror 105 and wafer 103. In an embodiment, third quarter wave plate 112c can be placed between any two aspheric surfaces 135. In another embodiment, third quarter wave plate 112c can be placed between wafer optical group 193 and fold mirror 105 or it can be placed at any position within wafer optical group 193. As would be understood by one having ordinary skill in the art, wafer optical group 192 can include at least one aspheric surface 135 or none at all. Furthermore, aspheric surfaces 135(a, b, c, d, e) can be ones of lenses with either positive or negative refractive power. In an embodiment, wafer 103 is a semiconductor wafer.

In an embodiment, beam-splitter 120 includes two optical prisms.

In an embodiment, projection system 102 receives light from reticle 101 and magnifies, focuses and/or aligns the light and forms an image on wafer 103. Intermediate image formation system 104 within projection system 102 also receives light from reticle 101 and magnifies, focuses and/or aligns the light to form an intermediate image 150.

Reticle optical group 191 initially processes a beam of light received from reticle 101. An image pattern is formed on reticle 101 is the image pattern to be formed on semiconductor wafer 103. Reticle optical group 191 focuses, magnifies and/or aligns the light entering through reticle 101.

In one embodiment, beam-splitter 120 is a polarized beam-splitter and includes a polarized mirror. Thus, the light having p-polarization state can pass through it, while light having s-polarization state is reflected by it. Because of beam-splitter's 120 above functions, the light having a s-polarized state is reflected directly onto concave mirror optical group 192.

Concave mirror 107 magnifies an incoming image reflected by beam-splitter 120. In addition, concave mirror 107 reflects the light from beam-splitter 120 through second quarter wave plate 112b. Second quarter wave plate 112b changes light's polarization. Because of change in polarization, the light is able to enter and pass through beam-splitter 120. Concave mirror 107 performs these tasks, as well as any other potential tasks, in a manner which is known to those skilled in the art of the present invention.

Figure 1B:
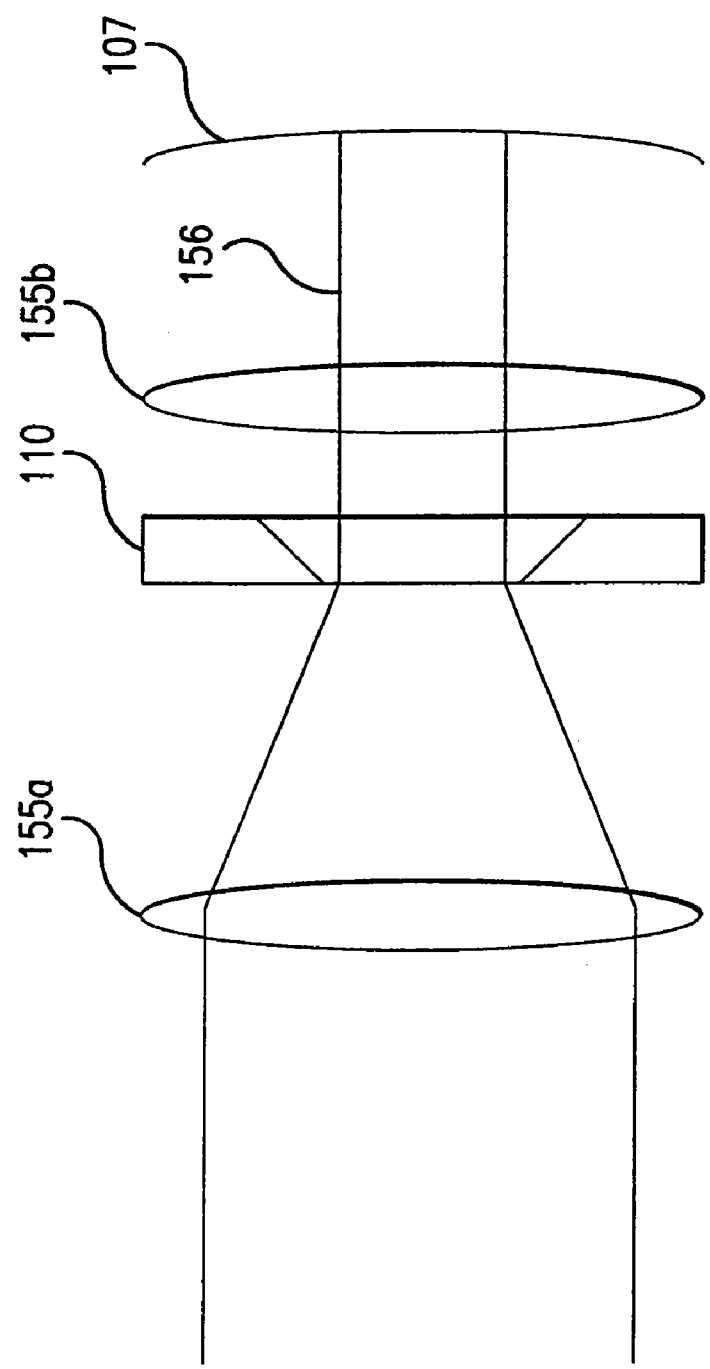

In an embodiment, concave mirror optical group 192 includes aperture stop 110. Aperture stop 110 is placed between aspherical surface 115c and concave mirror 107. FIG. 1b illustrates aperture stop 110. Aperture stop 110 is shown to be placed between optical objects 155a and 155b. Optical objects 155a and 155b are placed in a light's path 156 to and from concave mirror 110. Aperture stop 110 has a narrower point of entry for the light directed towards concave mirror 107. On the other hand, aperture stop 110 has a wider point of entry for the light that is reflected by concave mirror 107. Aperture stop 110 limits the amount of light and the light rays which are directed to and from concave mirror 107. Among other things, aperture stop 110 position can help maintain telecentricity of beams in reticle and wafer spaces. As would be understood by one having ordinary skill in the art given this description, other embodiments of aperture stop 110 are possible.

Referring back to FIG. 1*a*, fold mirror 105 receives the light reflected by concave mirror 107 and passed through beam-splitter 120. In an embodiment, fold mirror 105 is a flat mirror without any optical power. In another embodiment, fold mirror 105 has a power and further magnifies and/or aligns the light coming from beam-splitter 120.

FIG. 1*a* embodiment illustrates reticle 101 and wafer 103 in parallel plane arrangement. Reticle 101 and reticle optical group 191 are located on a first beam axes 181. Wafer 103 and wafer optical group 193 are located on a second beam axes 182. In FIG. 1*a* embodiment, first beam axes 181 is parallel to second beam axes 182. This embodiment keeps reticle 101 and wafer 103 parallel to each other, which allows for efficient manipulation reticle 101 and wafer 103.

Wafer optical group 193 receives focused image from beam-splitter 120 and fold mirror 105. In an embodiment, aspheric surfaces 135 (*a, b, c, d, e*) of wafer optical group 193 magnify and align the intermediate image 150 generating the image on wafer 103. Aspherical surfaces 135 can be ones of lenses having various refractive powers. The magnified and/or aligned light forms a pattern on semiconductor wafer 103, which is similar to the image pattern on reticle 101.

i. Image Path

FIG. 1*a* illustrates an image path of a beam of light in the first embodiment of projection system 102. In this embodiment, the circular polarized light enters through reticle 101 and passes through reticle optical group 191. Light 171 is magnified, focused and/or aligned using aspherical surface 108. Furthermore, light 171 passes through first quarter wave plate 112*a*, which changes light 171 polarization state from circular to s-polarized.

Subsequently, light 171 enters through beam-splitter 120. Beam-splitter 120 reflects s-polarized light 171. Concave mirror optical group 192 receives reflected light 172. Light 172 passes through second quarter wave plate 112*b*, which changes light 172 polarization to circular state. Concave mirror 107 then reflects light 172. Optical objects of concave mirror optical group 192 further focus, magnify and/or align light before concave mirror 107 reflects light 172. In an embodiment, aperture stop 110, placed between concave mirror optical group 192 and concave mirror 107, limits beam sizes.

After reflection from concave mirror 107, circular polarized light 173 passes through quarter wave plate 112*b* for the second time and changes its state from circular to p-polarized. The optical objects in concave mirror optical group 192 magnify and/or align image represented by polarized light 173 before light 173 enters beam-splitter 120. P-polarized light 173 passes through beam-splitter 120, because beam-splitter is transparent for p-polarized light.

Fold mirror 105 receives p-polarized, focused light 173 and reflects it into wafer optical group 193. Fold mirror 105 reflects light 173 as p-polarized light 174.

After reflection by fold mirror 105, light 174 forms an intermediate image 150 (as shown in FIG. 1*a*). Intermediate image 150 forms before light 174 passes through wafer optical group 193. Intermediate image 150 is a real image of the image obtained from reticle 101. As would be understood by one having ordinary skill in the art, intermediate image 150 can be one times the real image or slightly less or greater than the real image.

Light 174 passes through wafer optical group 193, where it is further focused, magnified and/or aligned by the optical objects within wafer optical group 193. Focused, magnified and/or aligned light 174 forms an image pattern on semiconductor wafer 103. Third quarter wave plate converts p-polarized light 174 into circular polarized light in order to decrease polarization HV bias effect (the difference between width of horizontal and vertical lines due to polarization) in photoresist. The image pattern on semiconductor wafer 103 is similar to the image pattern formed on reticle 101.

An advantage of this design, is that reticle 101 and wafer 103 are parallel to each other. This simplifies reticle 101 and wafer 103 handling. Furthermore, intermediate image formation system 104 forms intermediate image 150 after reflection by fold mirror 105 and before passage through wafer optical group 193. An advantage of this is that this simplifies field curvature and chromatic aberration corrections of image. This generates a better quality image on semiconductor wafer 103 and reduces errors in image formation.

As would be understood by one having ordinary skill in the art given this description, different combinations of quarter wave plates 112 (*a, b, c*) can be included in projection system 102. Furthermore, quarter wave plates 112 can be substituted with half wave plates. In an embodiment, if light passing through reticle 101 is s-polarized, then first quarter wave plate 112*a* is not needed and can be removed. However, if light passing through reticle 101 is p-polarized, then first quarter wave plate 112*a* can be substituted with a first half wave plate 112*a*. In another embodiment, if the light directed towards wafer 103 should be s-polarized, then third quarter wave plate 112*c* can be removed. However, if the light directed towards wafer 103 should be p-polarized, then third quarter wave plate 112*c* can be substituted with a third half wave plate 112*c*. Furthermore, circular polarized light in both reticle 101 and wafer 103 spaces can be used to decrease polarization effects for difference between horizontal and vertical lines. First and third quarter wave plates 112*a* and 112*c* function to reduce such polarization effects. In any case the second quarter wave plate 112*b* must be placed between concave mirror 107 and beam-splitter 120 for proper operation of the exposure system 100.

In an embodiment, projection system 102 can operate using ultraviolet light having a wavelength of 157 nm or less. Because of such wavelength, calcium fluoride can be used for manufacturing elements in projection system 102. As would be understood by one having ordinary skill in the art, other light wavelengths and/or materials can be used to implement projection system 102. Furthermore, in an example embodiment, projection system 102 can be built according to the following unfolded data representing optical elements in projection system 102 (as shown in Table 1 in Appendix A).

B. Other Example Embodiments

Figure 2A:
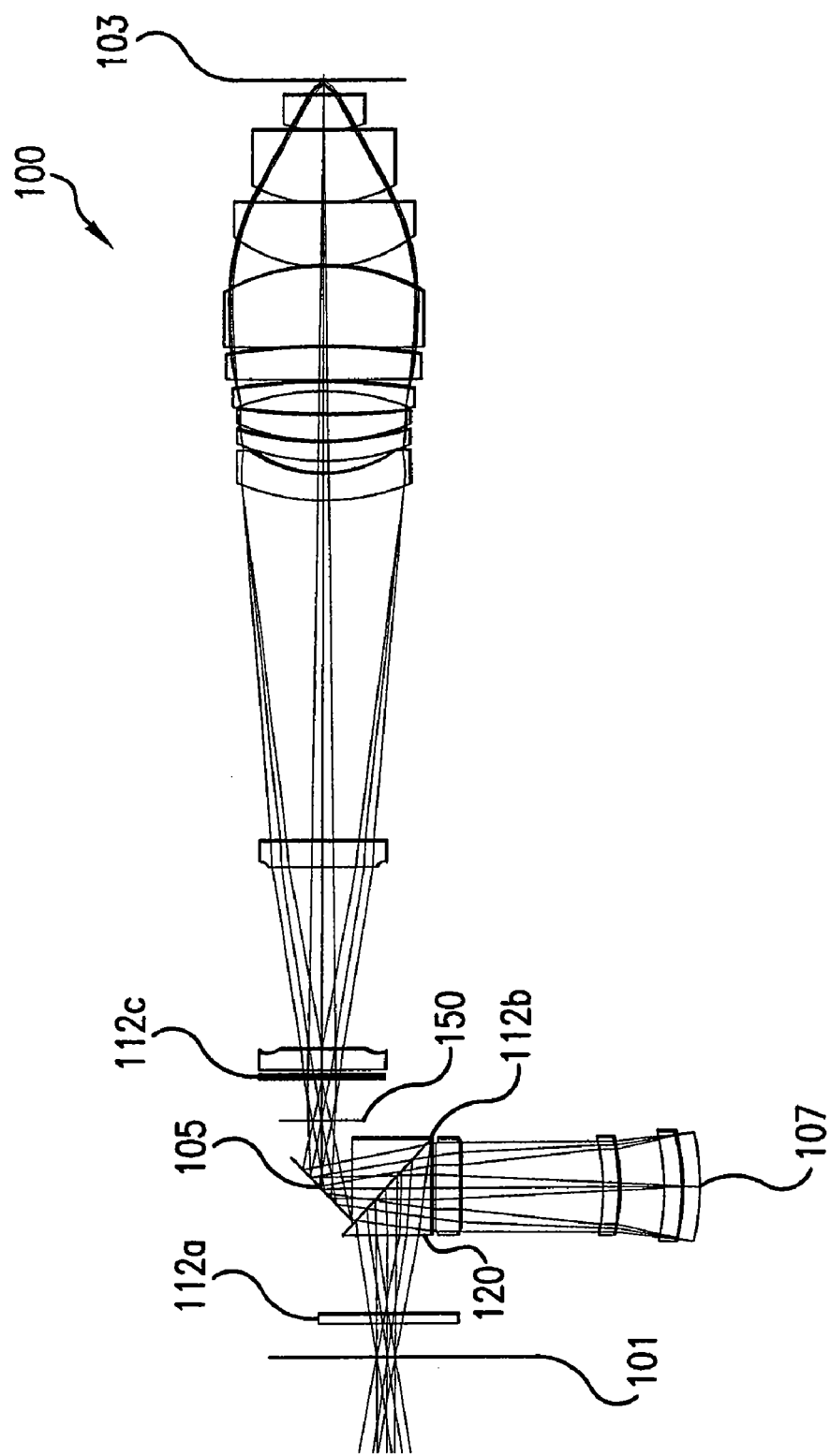
FIG. 2a illustrates another embodiment of a high numerical aperture exposure system, according to the present invention.
Figure 2B:
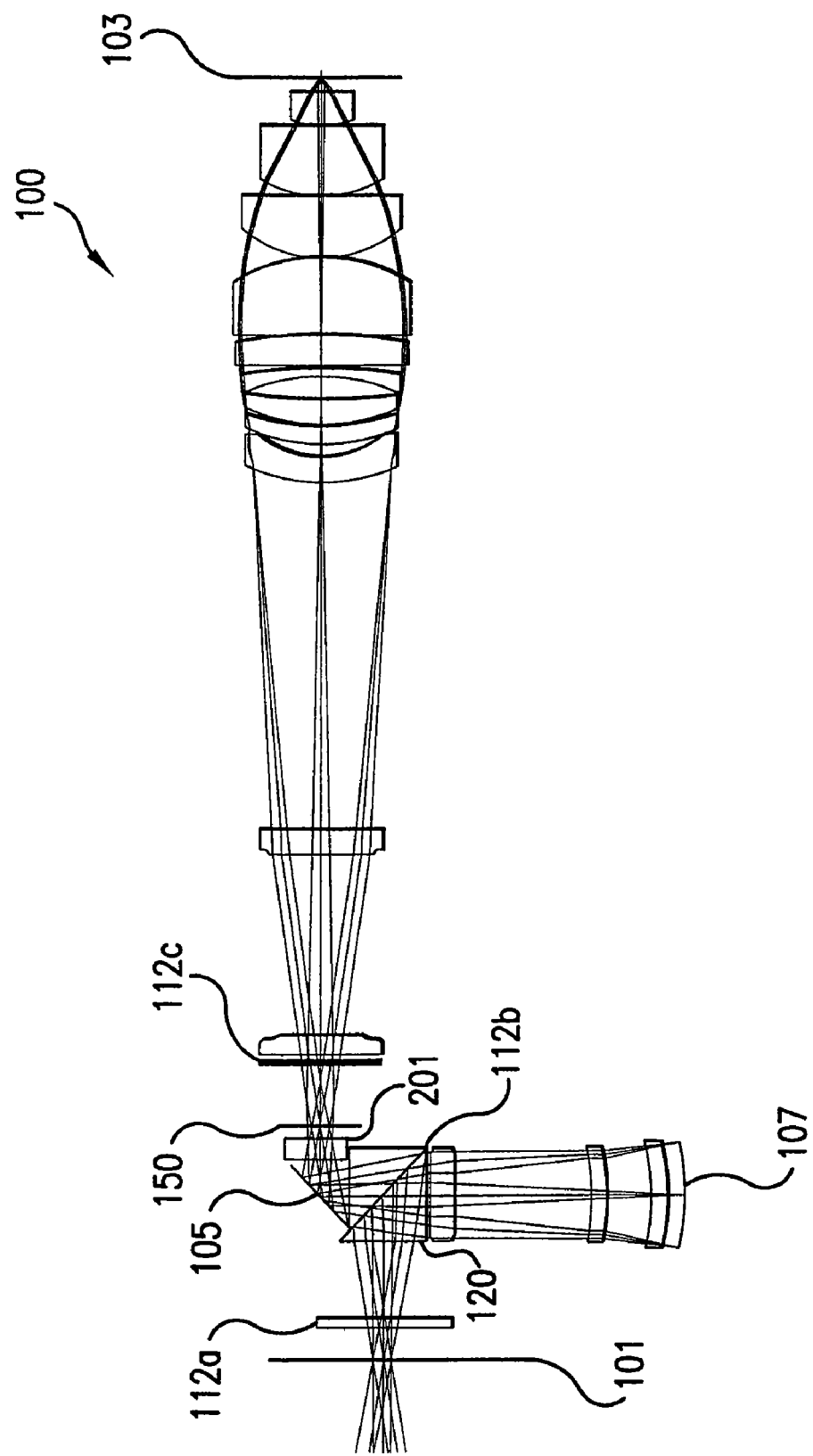
FIG. 2b illustrates another embodiment of a high numerical aperture exposure system, according to the present invention.

FIGS. 2*a* and 2*b* illustrate alternative embodiments of exposure system 100. FIG. 2*a* illustrates an embodiment without an optical element inserted between intermediate image 150 and fold mirror 105. FIG. 2*b* illustrates an embodiment of exposure system 100 with the optical element inserted between intermediate image 150 and fold mirror 105.

FIG. 2*a* illustrates exposure system 100 including reticle 101, beam-splitter 120, concave mirror 107, fold mirror 105 and semiconductor wafer 103. A beam of light passes through reticle 101 and enters beam-splitter 120. According to one feature, a quarter wave plate 112 is inserted between reticle 101 and beam-splitter 120. Quarter wave plate 112 changes polarization of the beam of light entering through the image outline on reticle 101. An optical element can be inserted between fold mirror 105 and wafer optical group, as shown in FIG. 2b.

Beam-splitter 120 reflects light onto concave mirror 107. In an embodiment, after reflection by beam-splitter 120, the light passes through a plurality of optical objects including second quarter wave plate 112b for change of polarization state. The light is magnified, focused and/or aligned by these optical objects. In an embodiment, these optical objects can be lenses having a positive refractive power.

Concave mirror 107 mirror receives magnified, focused and/or aligned light and reflects it back into beam-splitter 120. Concave mirror 107 also has a positive refractive power. The light then passes through polarization beam-splitter 120 to fold mirror 105.

Fold mirror 105 reflects light from beam-splitter 120 onto semiconductor wafer. The light reflected by fold mirror 105 forms intermediate image 150. After formation of intermediate image 150, the light is further focused, aligned and/or magnified by optical elements placed between fold mirror 105 and semiconductor wafer 103. Polarization state of light is changed to circular by third quarter wave plate 112c. The focused, magnified and/or aligned light forms an image on semiconductor wafer 103.

To further improve formation of the image on semiconductor wafer 103, an optical element 201 can be placed between fold mirror 105 and intermediate image 150, as shown in FIG. 2b. In an embodiment, optical element 201 can be a lens having a positive or a negative refractive power. Optical element 201 helps further define location of intermediate image 150 and can shorten the overall optical path length through exposure system 100. It also helps to improve distortion of image. In another embodiment, a group of optical elements can be placed between intermediate image 150 and fold mirror 105.

Figure 3A:
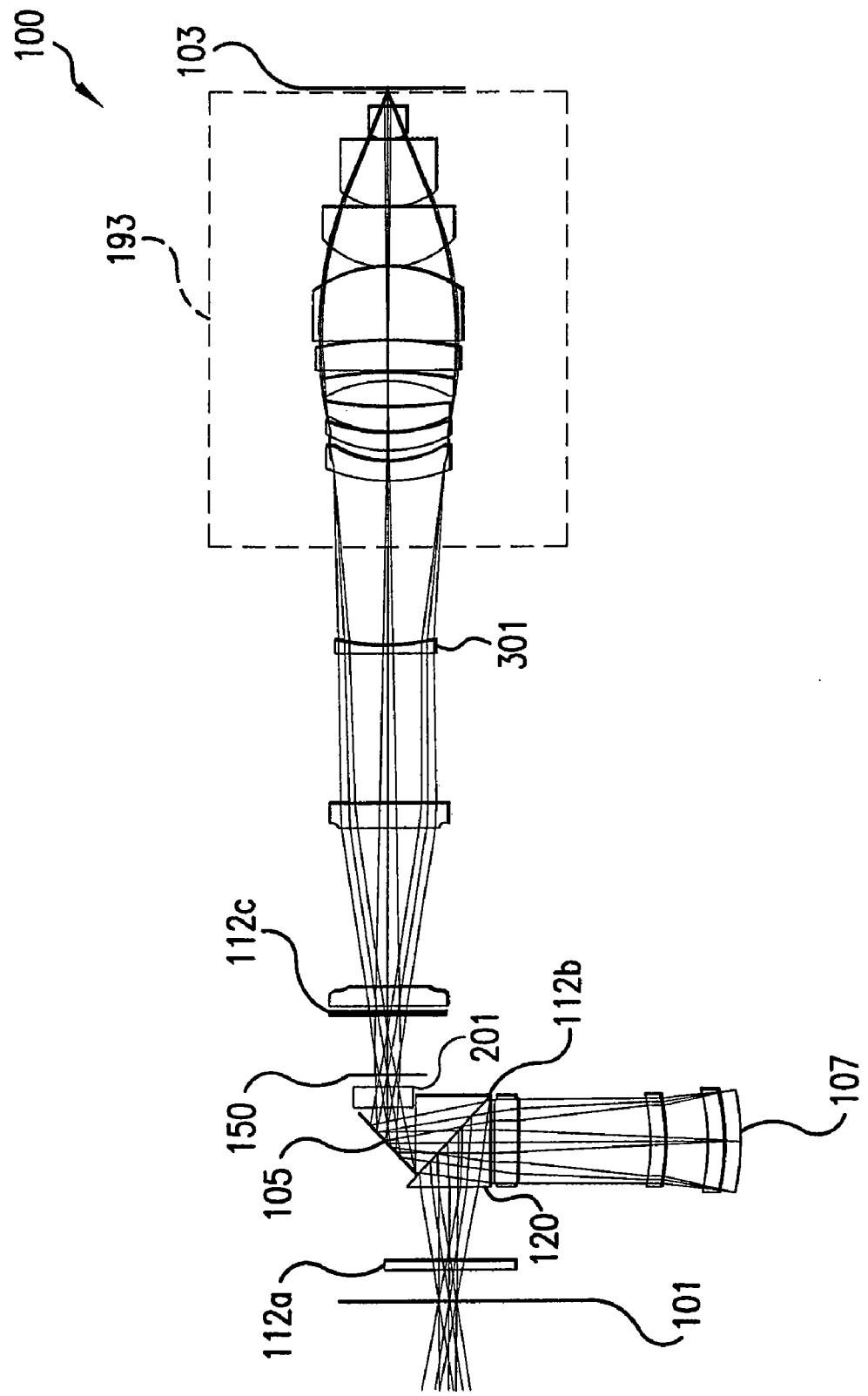
FIG. 3a illustrates another embodiment of a high numerical aperture exposure system, according to the present invention.
Figure 3B:
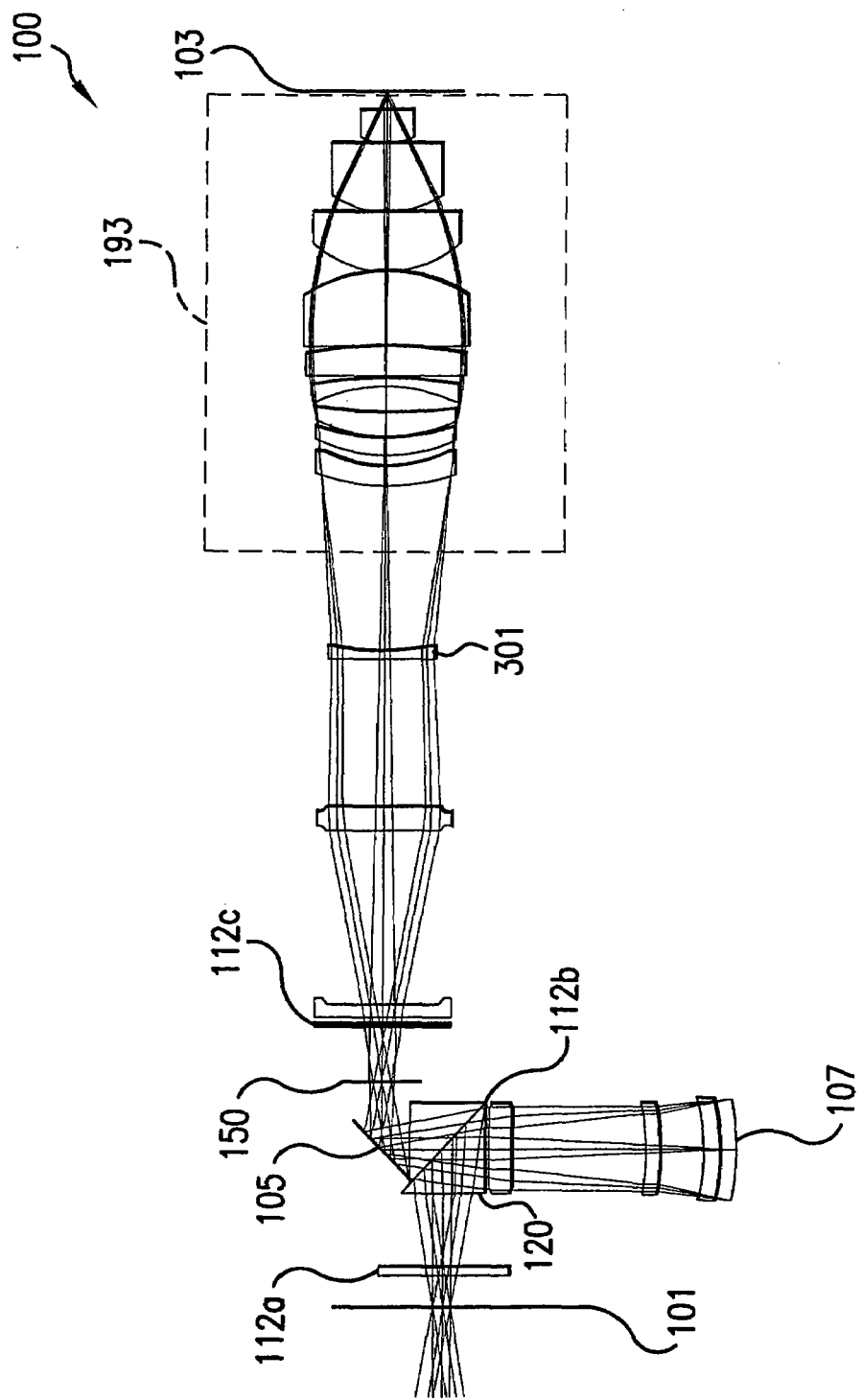
FIG. 3b illustrates another embodiment of a high numerical aperture exposure system, according to the present invention.

FIGS. 3a and 3b illustrate embodiments of exposure system 100 having additional optical groups or elements inserted in the optical path before and after formation of intermediate image 150. FIG. 3a illustrates exposure system 100 including optical element 201 and additional optical groups placed in the optical path after intermediate image 150. FIG. 3b illustrates exposure system 100 having an additional optical groups placed in the optical path after intermediate image 150 without optical element 201. Embodiments of FIGS. 3a and 3b are similar in structure to FIGS. 2a and 2b. Therefore, only differences between these embodiments need be discussed.

Referring back to FIG. 3a, exposure system 100 includes optical element 201 and an additional optical group 301. As discussed with respect to FIG. 2b, optical element 201 is placed between fold mirror 105 and intermediate image 201. Additional optical group 301 is placed between intermediate image 150 and wafer optical group 193, as shown in FIG. 3a. Additional optical group 301 along with optical element 201 helps further define the image formed on semiconductor wafer 103. Additional optical group 301 further magnifies, focuses and/or aligns the light reflected by fold mirror 105. In an embodiment, additional optical group 301 can include a single optical element, which can be an aspheric surface having a positive or negative refractive power. In another embodiment, additional optical group 301 can include a plurality of optical elements, which can be aspheric surfaces having a positive or negative refractive power. As would be understood by one having ordinary skill in the art, optical element 201 can include a single aspheric surface or a plurality of aspheric surfaces having various refractive powers.

FIG. 3b embodiment illustrates exposure system 100 with additional optical group 301 and without optical element 201. Placement of additional optical group 301 further improves quality of image formed on semiconductor wafer 103.

Figure 4:
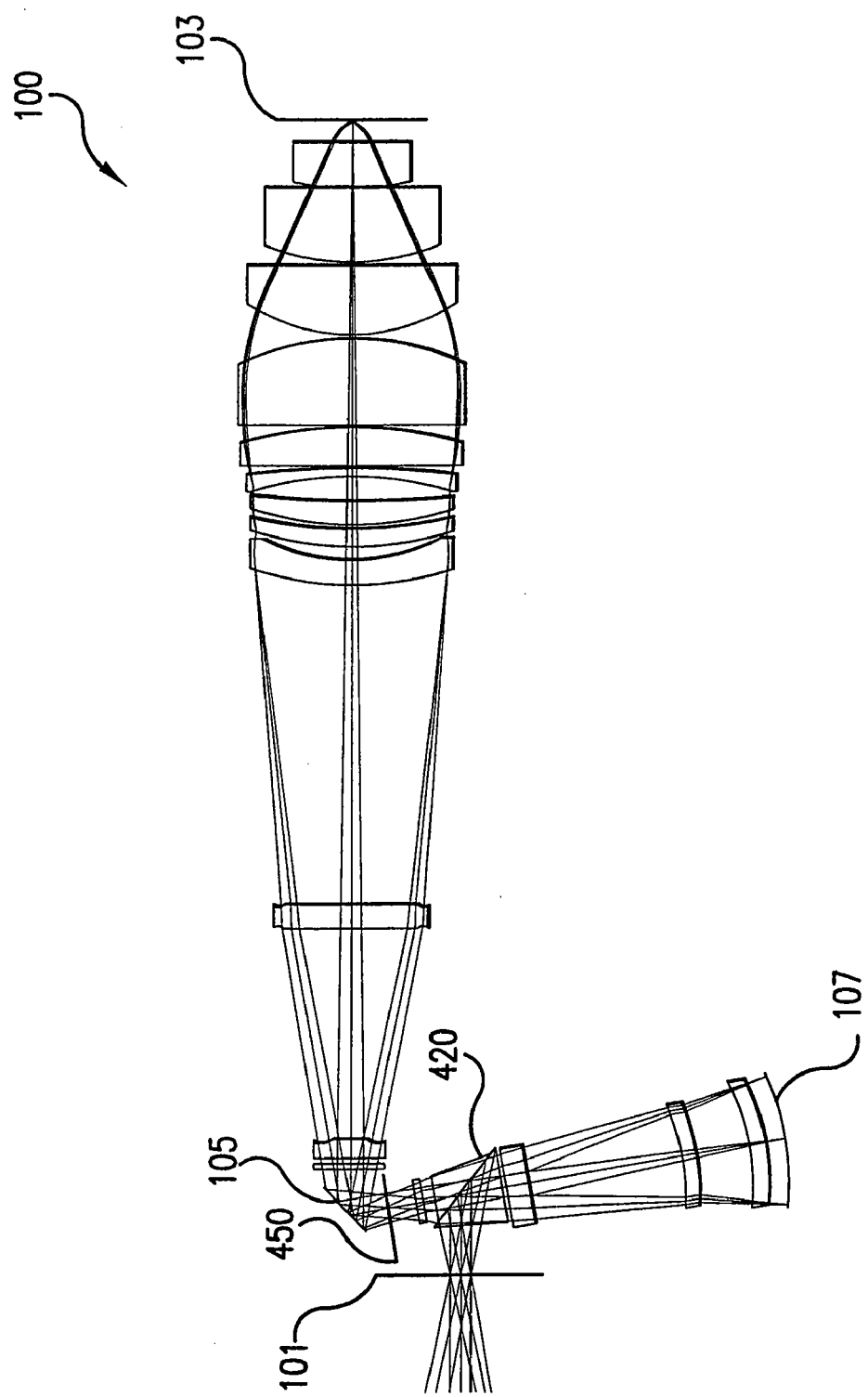
FIG. 4 illustrates another embodiment of a high numerical aperture exposure system, according to the present invention.

FIG. 4 illustrates another embodiment of exposure system 100 having a tilted beam-splitter 420. This embodiment of exposure system 100 includes all elements of FIG. 1 embodiment.

In FIG. 4, a beam of light is directed from reticle 101 towards tilted beam-splitter 420. Tilted beam-splitter 420 reflects the light towards concave mirror 107. The light reflected by tilted beam-splitter 420 is magnified, focused and/or aligned by a concave mirror optical elements. The concave mirror optical elements are placed between tilted beam-splitter 420 and concave mirror 107. In an embodiment, tilted beam-splitter 420 can be tilted so that the light directed from reticle 101 is reflected at an angle different than 90°.

Concave mirror 107 reflects the light back into tilted beam-splitter 420. Tilted beam-splitter 420 allows the polarized light to pass through. An intermediate image 450 forms after the polarized light passes through tilted beam-splitter 420.

After formation of intermediate image 450, the light is reflected using fold mirror 105. Fold mirror 105 directs the reflected light towards semiconductor wafer 103, where the light forms an image similar to the image outline on reticle 101.

Intermediate image 450 forms between fold mirror 105 and tilted beam-splitter 420. Furthermore, placement of tilted beam-splitter 420 into exposure system 100 allows reticle 101 and semiconductor wafer 103 to remain parallel to each other. In an embodiment, various optical elements and/or groups of elements, such as those described in FIGS. 2a, 2b, 3a, and 3b, may be placed in optical path to enhance the quality of image on semiconductor wafer 103. As would be understood by one having ordinary skill in the art, other embodiment of the exposure system 100 are possible.

C. Projection System With Perpendicular Arrangement of Reticle and Semiconductor Wafer FIGS. 5a and 5b illustrate an embodiment of a exposure system 500 including a reticle 501 placed in a perpendicular arrangement with semiconductor wafer 530.

Figure 5A:
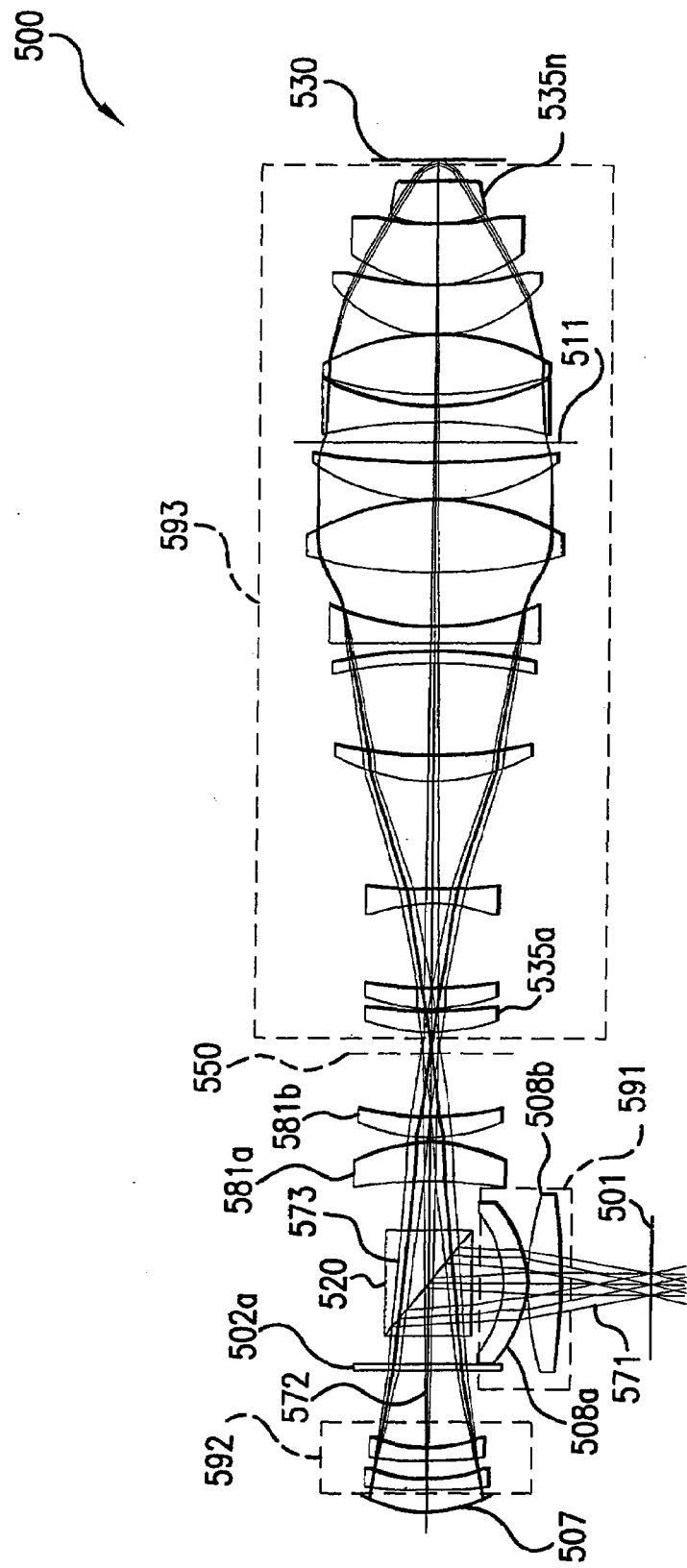
FIG. 5a illustrates another embodiment of a high numerical aperture exposure system, according to the present invention.
Figure 5B:
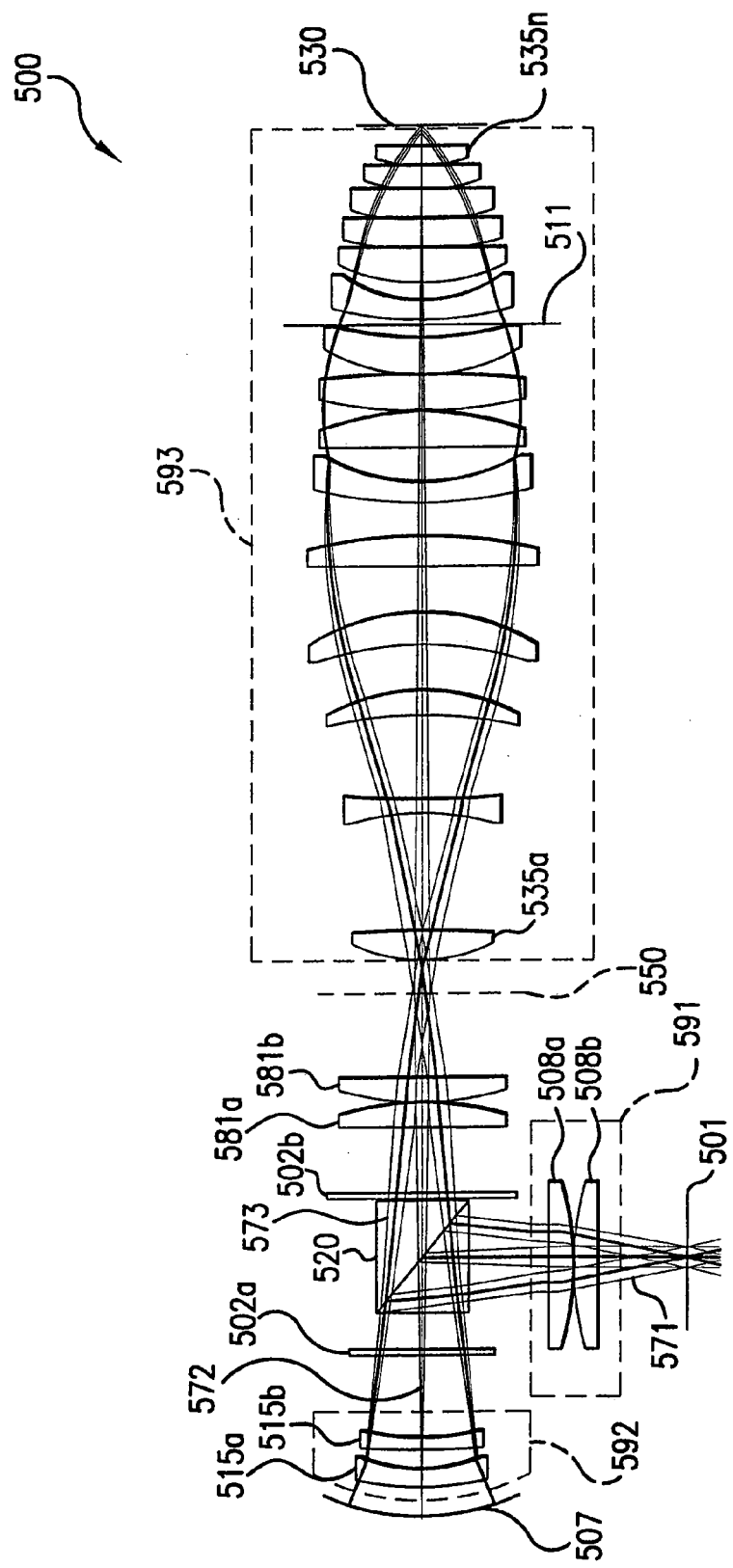
FIG. 5b illustrates another embodiment of a high numerical aperture exposure system, according to the present invention.

FIG. 5a illustrates exposure system 500 including a reticle 501, a reticle optical group 591, a beam-splitter 520, a concave mirror optical group 592, a concave mirror 507, a wafer optical group 593 and a wafer 530.

Reticle optical group 591 is placed between reticle 501 and beam-splitter 520. Concave mirror optical group 592 is placed between concave mirror 507 and beam-splitter 520. Wafer optical group 593 is placed between beam-splitter 520 and wafer 530. Beam-splitter 520 separates wafer optical group 593 and concave mirror optical group 592.

In an embodiment, reticle 501 is perpendicular to wafer 530. It is understood by one having ordinary skill in the art, that other configurations of each optical object in exposure system 500 are possible.

Reticle optical group 591 includes aspheric surfaces 508a and 508b. In an embodiment, aspheric surfaces 508a and 508b can be lenses having a positive or a negative refractive power. Furthermore, reticle optical group 591 can have a plurality of aspheric surfaces similar to aspheric surfaces 508 (a, b).

Concave mirror optical group 592 includes a plurality of aspheric surfaces 515(a, b). In an embodiment, a first quarter wave plate 502a can be placed between beam-splitter 520 and aspheric surface 515b, as shown in FIG. 5a. First quarter wave plate 502a is present because the light that is reflected by concave mirror 507 is a polarized light. Furthermore, aspheric surfaces 515(a, b) can be lenses with either positive or negative refractive power.

Beam-splitter 520 separates concave mirror optical group 592 and wafer optical group 593. In an embodiment, aspheric surfaces 581a and 581b can be placed between beam-splitter 520 and wafer optical group 593. Aspheric surfaces 581a and 581b can be lenses having positive or negative refractive power.

Wafer optical group 593 includes a plurality of aspheric surfaces 535(a, b, ... n) and an aperture stop 511. In an embodiment, aperture stop 511 can be placed between any aspheric surfaces 535. As would be understood by one having ordinary skill in the art wafer optical group 593 can include at least one aspheric surface 535 or none at all. Furthermore, aspheric surfaces 535(a, b, ... n) can be lenses with either positive or negative refractive power. In an embodiment, wafer 530 is a semiconductor wafer.

FIG. 5b illustrates another embodiment of exposure system 500. FIG. 5b embodiment is similar to FIG. 5a embodiment. FIG. 5b embodiment further includes a second quarter wave plate 502b. Second quarter wave plate 502b is placed between beam-splitter 520 and wafer optical group 593 and converts p-polarized light into circular polarized. As would be understood by one having ordinary skill in the art, other locations of second quarter wave plate 502b are possible. In an embodiment, second quarter wave plate 502b can be placed between beam-splitter 520 and aspheric surfaces 581 (a, b).

Functions of optical elements and objects in FIGS. 5a and 5b are similar to the corresponding optical elements and objects described in FIG. 1a. As would be understood by one having ordinary skill in the art, other embodiments of exposure system 500 are possible.

i. Image Path

FIG. 5a illustrates an image path of a beam of light in the embodiment of exposure system 500. The light enters through reticle 501 and passes through reticle optical group 591. Light 571 is magnified, focused and/or aligned using aspherical surfaces 508 (a, b).

Subsequently, light 571 enters beam-splitter 520. Beam-splitter 520 reflects light 571 towards concave mirror 507. Concave mirror optical group 592 receives reflected light 572. Concave mirror 507 reflects light 572. Optical objects of concave mirror optical group 592 further focus, magnify and/or align light before concave mirror 507 reflects light 572.

After polarization change, polarized light 572 passes back through first quarter wave plate 502a into beam-splitter 520. First quarter wave plate 502a converts s-polarized light into p-polarized light in double pass. The optical objects in concave mirror optical group 572 magnify and/or align image represented by polarized light 573 before light 573 enters beam-splitter 520. Polarized light 573 passes through beam-splitter 520, because beam-splitter is transparent for p-polarized light.

After reflection by passing through beam-splitter 520, light 573 forms an intermediate image 550 (as shown in FIG. 5a). Intermediate image 550 forms before light 573 passes through wafer optical group 593. Intermediate image 550 represents a concentrated image of the image outline formed on reticle 501.

Light 573 passes through wafer optical group 593, where it is further focused, magnified and/or aligned by the optical objects within wafer optical group 593. Furthermore, light 573 passes through aperture stop 511. Aperture stop 511 limits the beams passing through the optical objects in exposure system 500. Focused, magnified and/or aligned light 573 forms an image pattern on semiconductor wafer 530. The image pattern on semiconductor wafer 530 is similar to the image pattern formed on reticle 501.

The exposure system 500 forms intermediate image 550 before passage through wafer optical group 593. An advantage of this is that a real image of the reticle image outline is formed before it is further magnified by wafer optical group 593. This generates a better quality image on semiconductor wafer 530.

Image path of a beam of light of in the embodiment of projection system 500 shown in FIG. 5b is similar to the image path of a beam of light in the embodiment of projection system 500 shown FIG. 5a. In FIG. 5b, polarized light 573 after passage through beam-splitter 520 is processed by second quarter wave plate 502b. Second quarter wave plate 502b converts p-polarized light into circular polarized light in order to decrease polarization HV bias effect in photoresist.

4. Conclusion

Example embodiments of the methods, systems, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

APPENDIX A

Table 1. Unfolded variant of projection system 102.

| Surface | Shape | R | Thickness | Material | Refr. Index | Clear aperture |
|---|---|---|---|---|---|---|
| S0 | Sphere | 1.00000000E+18 | 4.04000000E+01 | | | |
| S1 | Sphere | 1.00000000E+18 | 1.50000000E+01 | 'CAF2HL' | 1.55840983E+00 | 61.94068527 |
| S2 | Sphere | 1.00000000E+18 | 1.61077838E+01 | | | 64.00630951 |
| S3 | Sphere | 2.08484398E+02 | 2.23877908E+01 | 'CAF2HL' | 1.55840983E+00 | 70.15633392 |
| S4 | Sphere | 3.19636854E+03 | 2.04210144E+01 | | | 70.19083405 |

APPENDIX A-continued

Table 1. Unfolded variant of projection system 102.

| | | | | | | |
|---|---|---|---|---|---|---|
| S5 | Sphere | 1.00000000E+18 | 4.68000000E+01 | 'CAF2HL' | 1.55840983E+00 | 70.52800751 |
| S6 | Sphere | 1.00000000E+18 | 5.87000000E+01 | 'CAF2HL' | 1.55840983E+00 | 71.04325104 |
| S7 | Sphere | 1.00000000E+20 | 9.80059692E+01 | | | 71.68950653 |
| S8 | Sphere | −3.01431218E+02 | 1.40000000E+01 | 'CAF2HL' | 1.55840983E+00 | 73.21627808 |
| S9 | Asphere | −4.94964621E+02 | 6.91462506E+00 | | | 75.03929138 |
| S10 | Sphere | 1.00000000E+20 | 1.00000000E+01 | 'CAF2HL' | 1.55840983E+00 | 76.16336823 |
| S11 | Sphere | 1.00000000E+18 | 1.32726880E+02 | | | 76.77751923 |
| S12 | Sphere | −2.09445129E+02 | 1.50000000E+01 | 'CAF2HL' | 1.55840983E+00 | 87.66955566 |
| S13 | Asphere | −9.98569966E+03 | 3.23413727E+01 | | | 94.87953949 |
| S14 | Sphere | −1.74479377E+02 | 1.50000000E+01 | 'CAF2HL' | 1.55840983E+00 | 96.49688721 |
| S15 | Sphere | −2.98259799E+02 | 9.18447313E−01 | | | 107.0849533 |
| S16 | Sphere | 1.00000000E+18 | 3.96394673E+01 | | | 116.8063202 |
| S17 | Sphere | −2.34867910E+02 | 0.00000000E+00 | | | 120.5603409 |
| S18 | Sphere | 1.00000000E+18 | 3.96394673E+01 | | | 144.1954803 |
| S19 | Sphere | 1.00000000E+18 | 9.18447313E−01 | | | 116.8053207 |
| S20 | Sphere | 2.98259799E+02 | 1.50000000E+01 | 'CAF2HL' | 1.55840983E+00 | 106.8784027 |
| S21 | Sphere | 1.74479377E+02 | 3.23413727E+01 | | | 96.17844391 |
| S22 | Asphere | 9.98569966E+03 | 1.50000000E+01 | 'CAF2HL' | 1.55840983E+00 | 94.4390564 |
| S23 | Sphere | 2.09445129E+02 | 1.32726880E+02 | | | 87.06187439 |
| S24 | Sphere | 1.00000000E+18 | 1.00000000E+01 | 'CAF2HL' | 1.55840983E+00 | 74.69335175 |
| S25 | Sphere | 1.00000000E+18 | 6.91462506E+00 | | | 73.99819183 |
| S26 | Asphere | 4.94964621E+02 | 1.40000000E+01 | 'CAF2HL' | 1.55840983E+00 | 72.75138855 |
| S27 | Sphere | 3.01431218E+02 | 9.80059692E+01 | | | 70.82468414 |
| S28 | Sphere | 1.00000000E+20 | 5.87000000E+01 | 'CAF2HL' | 1.55840983E+00 | 67.78050995 |
| S29 | Sphere | 1.00000000E+18 | 4.68000000E+01 | 'CAF2HL' | 1.55840983E+00 | 66.50074768 |
| S30 | Sphere | 1.00000000E+18 | 3.11410255E+01 | | | 65.48042297 |
| S31 | Sphere | 1.00000000E+18 | 3.00000000E+01 | | | 64.42201996 |
| S32 | Sphere | 1.00000000E+18 | 6.73345479E+01 | | | 63.40238953 |
| S33 | Sphere | 3.24604990E+02 | 2.77279542E+01 | 'CAF2HL' | 1.55840983E+00 | 79.1359787 |
| S34 | Sphere | −6.60104118E+02 | 9.33390571E+01 | | | 80.556633 |
| S35 | Sphere | 3.41523637E+02 | 2.76894392E+01 | 'CAF2HL' | 1.55840983E+00 | 91.82581329 |
| S36 | Asphere | −1.31111328E+03 | 1.75634241E+02 | | | 91.35928345 |
| S37 | Sphere | −1.81426530E+02 | 1.50000000E+01 | 'CAF2HL' | 1.55840983E+00 | 80.44470215 |
| S38 | Sphere | −3.29996504E+02 | 1.23943080E+02 | | | 83.46720886 |
| S39 | Asphere | 3.66862073E+02 | 1.50000000E+01 | 'CAF2HL' | 1.55840983E+00 | 92.1856308 |
| S40 | Sphere | 1.55786819E+02 | 1.96960163E+01 | | | 90.64324188 |
| S41 | Asphere | 2.44513185E+02 | 4.57574011E+01 | 'CAF2HL' | 1.55840983E+00 | 93.5696106 |
| S42 | Sphere | −3.04137044E+02 | 1.78547351E+00 | | | 94.81729126 |
| S43 | Asphere | 2.85259979E+02 | 1.50000000E+01 | 'CAF2HL' | 1.55840983E+00 | 93.4552002 |
| S44 | Sphere | 1.40121239E+02 | 2.32981882E+01 | | | 89.02839661 |
| S45 | Sphere | 2.27271656E+02 | 4.68478058E+01 | 'CAF2HL' | 1.55840983E+00 | 92.01837921 |
| S46 | Sphere | −3.23130061E+02 | 7.00000000E−01 | | | 92.04230499 |
| S47 | Sphere | 1.00000000E+20 | 1.00000000E+01 | 'CAF2HL' | 1.55840983E+00 | 89.6495285 |
| S48 | Sphere | 1.00000000E+20 | 5.76206284E+01 | | | 88.56866455 |
| S49 | Asphere | 2.92972147E+02 | 4.57032276E+01 | 'CAF2HL' | 1.55840983E+00 | 89.68306732 |
| S50 | Sphere | −2.21115519E+02 | 4.47578982E+00 | | | 88.69377136 |
| S51 | Sphere | 1.01110043E+02 | 2.90052400E+01 | 'CAF2HL' | 1.55840983E+00 | 68.00528717 |
| S52 | Asphere | 1.75259779E+02 | 7.42432875E+00 | | | 59.95832825 |
| S53 | Sphere | 1.77740375E+02 | 2.45279382E+01 | 'CAF2HL' | 1.55840983E+00 | 56.41053772 |
| S54 | Sphere | 3.07271888E+02 | 1.00097148E+00 | | | 46.32455063 |
| S55 | Sphere | 1.42203182E+02 | 2.24505503E+01 | 'CAF2HL' | 1.55840983E+00 | 42.88007736 |
| S56 | Sphere | −9.01946893E+02 | 7.09772163E−01 | | | 33.47834015 |
| S57 | Sphere | 1.00000000E+18 | 8.00000000E+00 | 'CAF2HL' | 1.55840983E+00 | 31.3391571 |
| S58 | Sphere | 1.00000000E+18 | 8.00000000E+00 | | | 26.14181137 |
| S59 | Sphere | 1.00000000E+18 | 0.00000000E+00 | | | 13.28763199 |

| | S9 | S13 | S22 | S26 | S36 |
|---|---|---|---|---|---|
| A | 3.17691266E−08 | −2.26787663E−08 | 2.26787663E−08 | −3.17691266E−08 | 1.53462716E−08 |
| B | −3.52782438E−13 | 7.10048150E−13 | −7.10048150E−13 | 3.52782438E−13 | −1.28995932E−15 |
| C | 2.39223322E−17 | 3.18920155E−18 | −3.18920155E−18 | −2.39223322E−17 | −4.50477750E−19 |
| D | −2.39986607E−20 | −1.26497070E−21 | 1.26497070E−21 | 2.39986607E−20 | 2.98347949E−22 |
| E | 5.47981877E−24 | −3.04891451E−26 | 3.04891451E−26 | −5.47981877E−24 | −8.83326381E−27 |
| F | −6.35921644E−28 | 2.14986734E−29 | −2.14986734E−29 | 6.35921644E−28 | −1.48824457E−30 |
| G | 2.95812334E−32 | −7.85383069E−34 | 7.85383069E−34 | −2.95812334E−32 | 1.09329457E−34 |

APPENDIX A-continued

Table 1. Unfolded variant of projection system 102.

|   | S39 | S41 | S43 | S49 | S52 |
|---|---|---|---|---|---|
| A | 2.64732535E-08 | -6.01564501E-08 | -1.44180074E-08 | -6.35401322E-09 | 2.50993681E-08 |
| B | -4.04563652E-12 | 4.33452925E-12 | -5.62286839E-13 | -9.34812771E-13 | 4.83870454E-12 |
| C | 3.18887823E-16 | -2.26701299E-16 | 8.86914338E-17 | 1.10539114E-16 | 1.15168901E-15 |
| D | -4.94622565E-20 | 4.46015033E-20 | -1.08633660E-20 | -3.68761547E-20 | -1.56877104E-19 |
| E | 5.20349562E-24 | -3.65866254E-24 | -8.69823662E-27 | 4.88205381E-24 | 3.94861516E-23 |
| F | -2.72692211E-28 | 9.34219220E-29 | 1.39890881E-28 | -3.37125772E-28 | -4.39082706E-27 |
| G | 6.35027425E-33 | 2.05646034E-34 | -5.66585052E-33 | 9.10339358E-33 | 2.77394479E-31 |

Asphere equation: $z = c*r2/(1+\text{sqrt}(1-c2*r**2))+A*y**4+B*y**6+C*y**8+D*y**10+E*y**12+F*y**14+G*y**16$
Surface S0 is reticle
Surface S59 is wafer
Wavelength is 157.63 nm
Aperture stop coincides with surface S16

What is claimed is:

1. A high numerical aperture projection system for projecting an image of a reticle onto a wafer, comprising:
   a beam-splitter;
   a reticle optical group;
   a quarter-wave plate between the reticle and said beam-splitter;
   a concave mirror;
   a concave mirror optical group, wherein said concave mirror optical group is between said concave mirror and said beam-splitter;
   a fold mirror;
   a wafer optical group;
   wherein a beam of light is directed through the reticle and said reticle optical group to said beam-splitter, then reflected by said beam-splitter onto said concave mirror, then reflected by said concave mirror onto said fold mirror through said beam-splitter, and is reflected by said fold mirror onto the wafer through said wafer optical group, the beam of light being directed to said beam-splitter having an s-polarization state and through said beam-splitter having a p-polarization state;
   wherein an intermediate image is formed between said beam-splitter and said wafer optical group when the beam of light passes through the system, the intermediate image being a real image of the image from the reticle.

2. The system of claim 1, wherein said concave mirror optical group further comprises a second quarter wave plate.

3. The system of claim 1, wherein said wafer optical group further comprises a third quarter wave plate.

4. The system of claim 1, wherein an aperture stop is between said concave mirror and said concave mirror optical group.

5. The system of claim 1, wherein an optical element is between said fold mirror and said intermediate image.

6. The system of claim 1, wherein said fold mirror is between said intermediate image and said beam-splitter.

7. The system of claim 1, wherein an optical element is between said fold mirror and said intermediate image, and an optical element is between said intermediate image and said wafer optical group.

8. The system of claim 1, wherein an optical element is between said fold mirror and said intermediate image, and an optical element is between said intermediate image and said wafer optical group.

9. The system of claim 1, wherein an optical element is between said intermediate image and said wafer optical group.

10. The system of claim 1, wherein said beam-splitter is a tilted beam-splitter.

11. A high numerical aperture projection system for projecting an image of a reticle onto a wafer, comprising:
    a beam-splitter;
    a reticle optical group separated from said reticle by a first quarter wave plate, wherein said reticle optical group is between said beam-splitter and said reticle;
    a concave mirror;
    a concave mirror optical group, wherein said concave mirror optical group is between said beam-splitter and said concave mirror;
    wherein an aperture stop is located between said concave mirror and said concave mirror optical group;
    a fold mirror, wherein said fold mirror is between said beam-splitter and the wafer; and
    a wafer optical group, wherein said wafer optical group is between said beam-splitter and the wafer;
    wherein a beam of light is directed through said reticle to said beam-splitter, then reflected by said beam-splitter onto said concave mirror, then passes through said aperture stop and is reflected by said concave mirror onto said fold mirror through said beam-splitter, and is reflected by said fold mirror onto the wafer through said wafer optical group, the beam of light being directed to said beam-splitter having an s-polarization state and through said beam-splitter having a p-polarization state; and
    wherein an intermediate image is formed between said fold mirror and said wafer optical group when the beam of light passes through the system, the intermediate image being a real image of the image from the reticle.

12. The system of claim 11, wherein said concave mirror optical group further comprises a second quarter wave plate.

13. The system of claim 11, wherein said wafer optical group further comprises a third quarter wave plate.

14. The system of claim 11, wherein an optical element is placed between said fold mirror and said intermediate image.

15. The system of claim 11, wherein said fold mirror is between said intermediate image and said beam-splitter.

16. The system of claim 11, wherein an optical element is placed between said fold mirror and said intermediate image, and an optical element is placed between said intermediate image and said wafer optical group.

17. The system of claim 11, wherein an optical element is placed between said fold mirror and said intermediate image, and an optical element is placed between said intermediate image and said wafer optical group.

18. The system of claim 11, wherein an optical element is placed between said intermediate image and said wafer optical group.

19. The system of claim 11, wherein an optical element is placed between said intermediate image and said wafer optical group.

20. The system of claim 11, wherein said beam-splitter is a tilted beam-splitter.

21. In an optical system, a method for forming an image of a reticle on a wafer plane by passing a light through the reticle, a quarter-wave plate between the reticle and a beam-splitter, the beam-splitter, and an aperture stop, comprising steps of:
    (a) directing light into a beam-splitter through the reticle and the quarter-wave plate;
    (b) reflecting the light from the beam-splitter toward a concave mirror;
    (c) directing the reflected light through the aperture stop;
    (d) reflecting light from the concave mirror through the beam-splitter onto a fold mirror, the light being directed into the beam-splitter having an s-polarization state and through the beam-splitter having a p-polarization state; and
    (e) reflecting light toward the wafer plane, said reflecting light toward the wafer plane further comprises forming an intermediate image between the fold mirror and the wafer plane, the intermediate image being a real image of the image from the reticle.

22. The method of claim 21, wherein said step (b) further comprises: directing light through a second quarter-wave plate, wherein the second quarter-wave plate is placed between the beam-splitter and the aperture stop.

23. The method of claim 21, wherein said step (d) further comprises: directing light through a third quarter-wave plate, wherein the third quarter-wave plate is placed between fold mirror and the wafer plane.

24. The method of claim 21, wherein said step (d) further comprises: forming an intermediate image between the fold mirror and the third quarter-wave plate.

25. In an optical system, a method for forming an image of a reticle on a substrate by passing light through the reticle, a quarter-wave plate between the reticle and a beam-splitter, and the beam-splitter, comprising the steps of:
    (a) passing light through the reticle, the quarter-wave plate, and the beam-splitter onto a concave mirror, wherein light is reflected by the concave mirror back into the beam-splitter, the light being reflected into the beam-splitter having an s-polarization state;
    (b) after reflection by the concave mirror, passing the light through the beam-splitter onto a fold mirror, wherein the light is reflected by the fold mirror, the light being passed through the beam-splitter having a p-polarization state;
    (c) forming an intermediate image between the fold mirror and the substrate, the intermediate image being a real image of the image from the reticle; and
    (d) directing the light onto the substrate.

* * * * *